(12) United States Patent
Jeon et al.

(10) Patent No.: US 6,753,221 B2
(45) Date of Patent: Jun. 22, 2004

(54) METHODS FOR FABRICATING SEMICONDUCTOR DEVICES HAVING CAPACITORS

(75) Inventors: Jeong-Sic Jeon, Kyunggi-do (KR); Chang-Jin Kang, Kyunggi-do (KR); Seung-Young Son, Seoul (KR); Jin-Hong Kim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/322,274

(22) Filed: Dec. 17, 2002

(65) Prior Publication Data

US 2003/0124792 A1 Jul. 3, 2003

(30) Foreign Application Priority Data

Dec. 27, 2001 (KR) .......................................... 2001-85991

(51) Int. Cl.[7] .......................................... H01L 21/8242
(52) U.S. Cl. .......................................... 438/253; 438/396
(58) Field of Search ................................ 438/253, 396

(56) References Cited

U.S. PATENT DOCUMENTS

| | | | | |
|---|---|---|---|---|
| 5,780,338 A | * | 7/1998 | Jeng et al. ................... | 438/253 |
| 6,222,722 B1 | * | 4/2001 | Fukuzumi et al. ........... | 361/305 |
| 6,403,444 B2 | * | 6/2002 | Fukuzumi et al. ........... | 438/396 |
| 6,479,343 B1 | * | 11/2002 | Hwang et al. ............... | 438/253 |
| 6,583,006 B2 | * | 6/2003 | Ping ............................ | 438/253 |
| 6,590,229 B1 | * | 7/2003 | Yamazaki et al. ............ | 257/71 |
| 2002/0019107 A1 | * | 2/2002 | Lin et al. ..................... | 438/396 |

FOREIGN PATENT DOCUMENTS

| | | |
|---|---|---|
| JP | 2000-101043 | 7/2000 |
| KR | 2000-45343 | 7/2000 |

OTHER PUBLICATIONS

English Language of Abstract for Korean Patent Publication No. 2000-45343, filed Jul. 15, 2000.
English Language of Abstract for Japanese Patent Publication No. 2000-101043, filed Jul. 4, 2000.

* cited by examiner

*Primary Examiner*—George Fourson
*Assistant Examiner*—Fernando L. Toledo
(74) *Attorney, Agent, or Firm*—Marger Johnson & McCollom, P.C.

(57) ABSTRACT

Methods for fabricating semiconductor devices having capacitors are provided. A plurality of storage node electrodes are formed on a semiconductor substrate. Then, a capacitor dielectric layer is formed over the storage node electrodes. A plate electrode layer is subsequently formed on the capacitor dielectric layer. A hard mask layer is then formed on the resultant structure where the plate electrode layer is formed so as to fill a gap between the adjacent storage node electrodes. The hard mask layer and the plate electrode layer are successively patterned to form a plate electrode.

25 Claims, 10 Drawing Sheets

Fig. 1

(Prior Art)

Fig. 2

(Prior Art)

Fig. 3

(Prior Art)

METHODS FOR FABRICATING SEMICONDUCTOR DEVICES HAVING CAPACITORS

RELATED APPLICATION

This application claims priority from Korean Patent Application No. 2001-85991, filed on Dec. 27, 2001, the contents of which are incorporated herein by reference in their entirety.

BACKGROUND OF THE INVENTION

1. Field of the Invention

The present invention relates to methods for fabricating semiconductor devices and, more particularly, to methods for fabricating semiconductor devices having capacitors.

2. Description of the Related Art

As integration levels of memory devices increase, the space taken up by a memory cell area is gradually decreased, resulting in a decrease in cell capacitance. To deal with this problem, much effort has been expended in the semiconductor industry. Such effort includes increasing surface areas of storage node electrodes or employing capacitor dielectric layers formed of a high-κ material.

Figure 1:
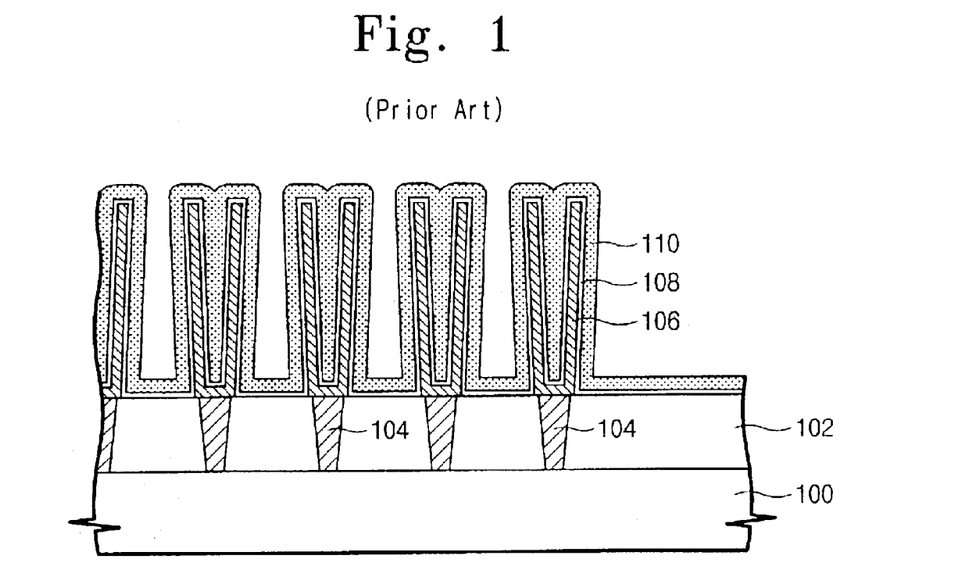
FIGS. 1 through 3 are cross-sectional views for illustrating a conventional method for fabricating a semiconductor device having a capacitor.
Figure 2:
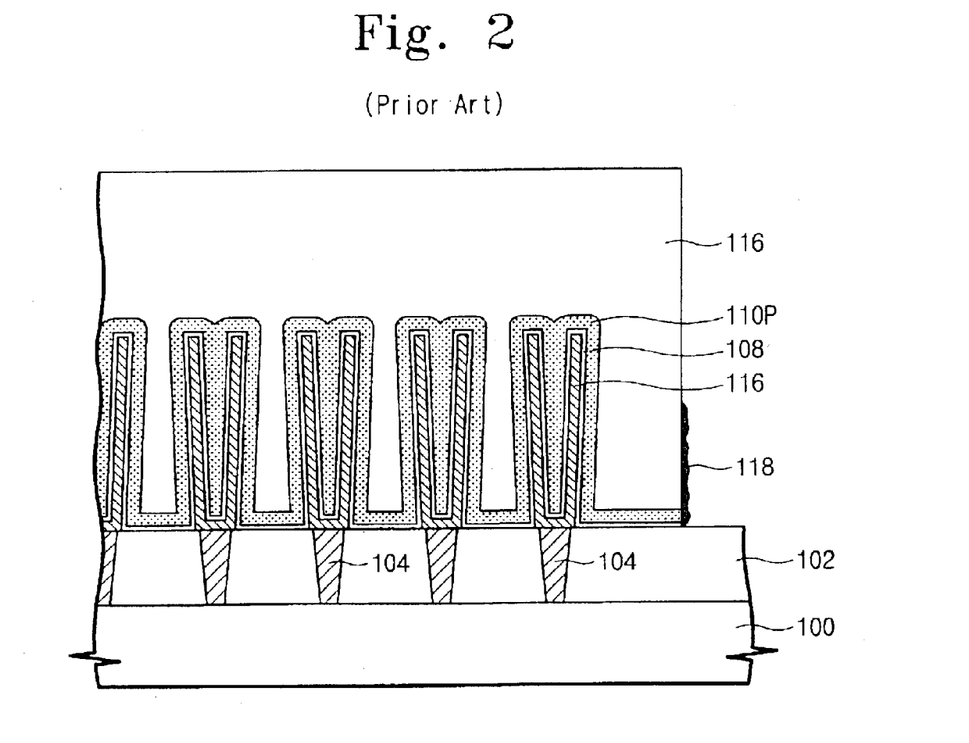
Figure 3:
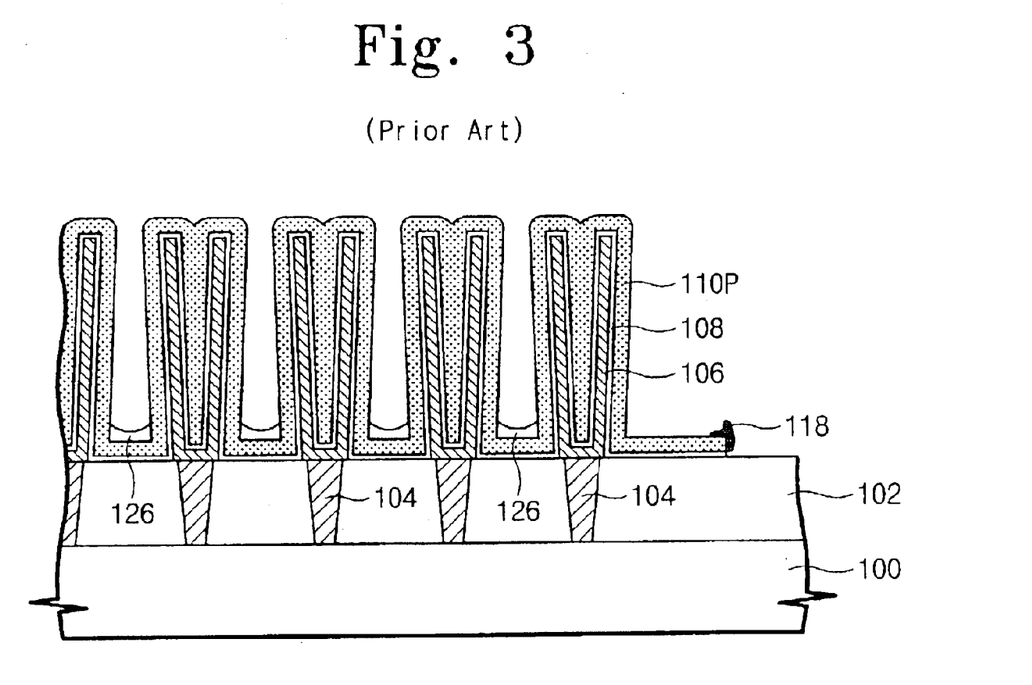

FIGS. 1 to 3 are cross-sectional views illustrating a conventional method for fabricating a semiconductor device having a capacitor.

Referring to FIG. 1, storage node plugs 104 are formed in a predetermined region of the semiconductor substrate 100 through an interlayer insulation layer 102 covering a semiconductor substrate 100. The storage node plugs 104 are connected to a transistor formed under the interlayer insulation layer 102, although not shown. A storage node electrode 106 is formed on each storage node plug 104. The storage node electrode 106 is formed as high as possible to increase the cell capacitance. Thereafter, a capacitor dielectric layer 108 is conformally formed on the storage node electrodes 106. The capacitor dielectric layer is typically composed of a material with a high dielectric constant, for example, tantalum oxide or aluminum oxide, so as to increase the cell capacitance.

Then, a plate electrode layer 110 is formed on the capacitor dielectric layer 108. The plate electrode layer 110 may be composed of an element of the platinum group to improve leakage current characteristics of the capacitor dielectric layer 108 having a high dielectric constant.

Referring to FIG. 2, a photoresist pattern 116 is formed on the plate electrode layer 110. The photoresist pattern 116 corresponds to an etch mask for forming a storage electrode according to predetermined regions of a cell array. The plate electrode layer 110 is patterned to form a plate electrode 110p using the photoresist pattern 116 as an etch mask. The plate electrode layer 110, composed of an element of the platinum group, has a low etch rate and reacts on an etch gas to form a hard polymer fence or etch byproducts 118 at etch boundaries.

Referring to FIG. 3, the photoresist pattern 116 is removed to expose the plate electrode 110p. As illustrated in FIG. 3, in the conventional method, the gap between the storage node electrodes 106, covered with the plate electrode 110p, has a high aspect ratio. As a result, a residue or scum 126 may remain in the gap. The greater the height of the storage node electrode 106 gets to increase surface areas of the storage node electrode 106, the more the residue 126 is likely to remain in the gap. Besides, in an ashing process for removing the photoresist pattern 116, a residue of the hard polymer fence 118 may remain at the boundaries of the plate electrode 110p. Thus, the remaining polymer fence 118 can become a contamination source in subsequent processes.

SUMMARY OF THE INVENTION

The present invention provides a method for fabricating a semiconductor device having a capacitor in which residue materials do not remain in a gap between adjacent storage node electrodes after forming a plate electrode.

The present invention also provides a method for fabricating a semiconductor device having a capacitor, which can remove polymer remaining at boundaries of the plate electrode after forming a plate electrode, without attacking the plate electrode.

According to an embodiment of the present invention, a plurality of storage node electrodes are formed in a predetermined region of a semiconductor substrate. A capacitor dielectric layer is then formed to conformally cover the storage node electrodes and the plate electrode layer is formed on the capacitor dielectric layer.

Then, a gap between the storage node electrodes is filled, using methods such as forming a hard mask layer on the resultant structure where the plate electrode layer is formed. The hard mask layer and the plate electrode layer are successively etched to form a plate electrode.

In accordance with another embodiment of the present invention, photoresist residues, which may remain in a gap between adjacent storage nodes due to a gap's high aspect ratio, can be prevented, while forming a plate electrode. Besides, when a plate electrode is composed of an element of a platinum group to improve leakage current characteristics of a highκ-dielectric material, hard polymer, which may remain at boundaries of the plate electrode, can be effectively removed.

DETAILED DESCRIPTION

Figure 4:
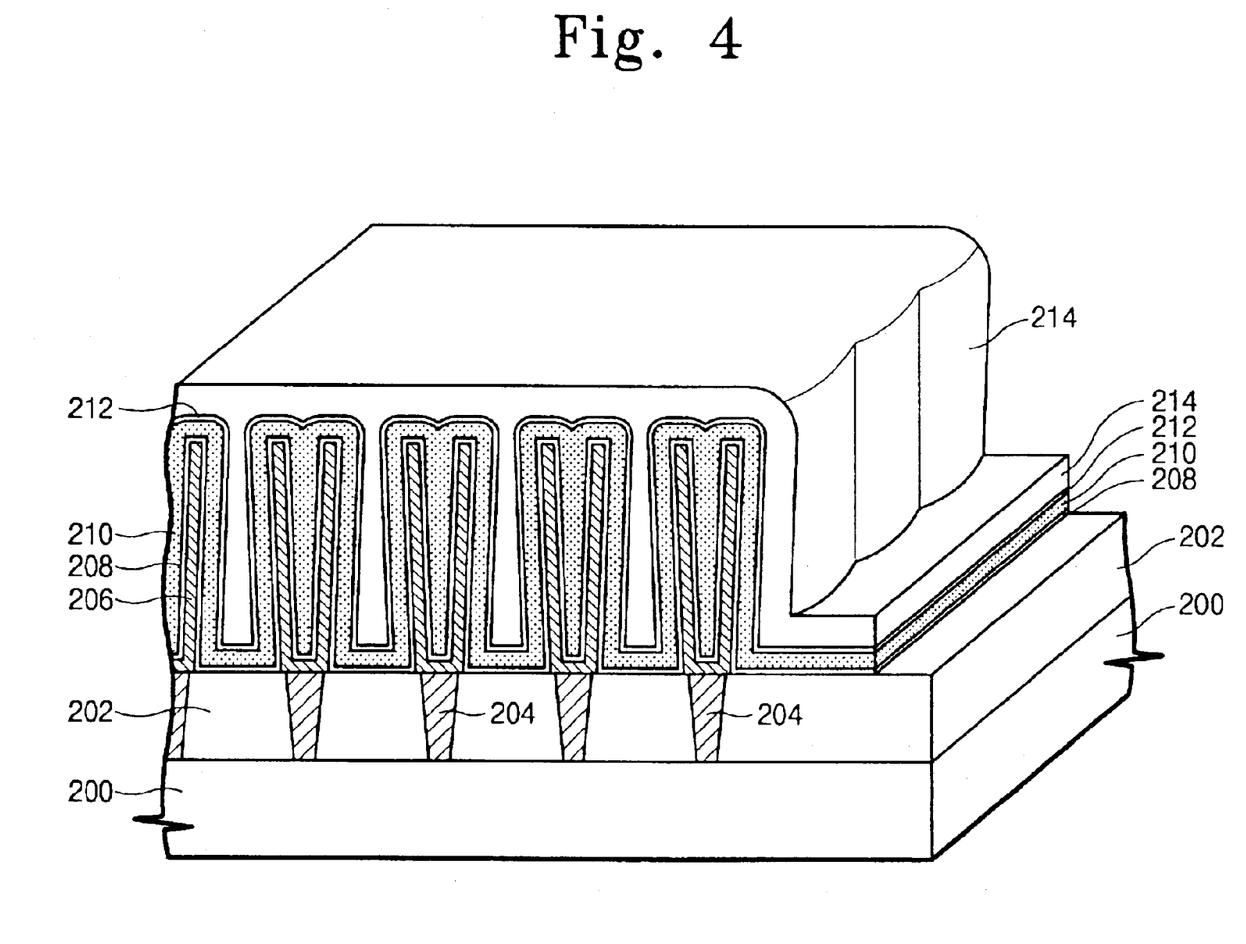
FIG. 4 is a perspective view for illustrating a semiconductor device having a capacitor, which comprises a storage node electrode of a cylinder structure according to one aspect of the present invention.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout. FIG. 4 is a perspective view of a semiconductor device having a capacitor including a storage node electrode of a cylinder structure according to an embodiment of the present invention.

Referring to FIG. 4, a plurality of storage node plugs 204 are connected to a predetermined region of a semiconductor substrate 200 through an interlayer insulation layer 202. The storage node plugs 204 are connected to MOS transistor source regions formed in the semiconductor substrate 200 (not shown). A storage node electrode 206 is connected to each storage node plug 204. The storage node electrode 206 corresponds to a lower electrode of a capacitor. The storage node electrodes 206 may be formed having various structures having a surface area as wide as possible while still occupying a small area. For example, the storage node electrode 206 may be of a cylinder-type or box-type structure disposed above the interlayer insulation layer 202. A plate electrode 210 covers the plurality of the storage node electrodes 206. The plate electrode 210 corresponds to an upper electrode of the capacitor. A capacitor dielectric layer 208 is interposed between the plate electrode 210 and the storage node electrodes 206. The capacitor dielectric layer 208 and the plate electrode 210 conformally cover the storage node electrodes 206. Accordingly, the plate electrode 210 forms a gap between the storage node electrodes 206. An insulation layer 214 is formed over the plate electrode 210 covering the storage node electrodes 206.

The plate electrode 210 may be positioned on each group of storage nodes. In other words, the plate electrode 210 may be separately formed on each sector of a cell array. Further, if the plate electrode 210 is formed of an element of the platinum group, an oxidation barrier layer 212 may be additionally interposed between the plate electrode 210 and the insulation layer 214 to prevent the oxidation of the plate electrode 210. The oxidation barrier layer 212 is preferably either a titanium oxide layer or a titanium nitride layer.

FIGS. 5 through 10 are cross-sectional views illustrating a method for fabricating a semiconductor device according to a first embodiment of the present invention.

Figure 5:
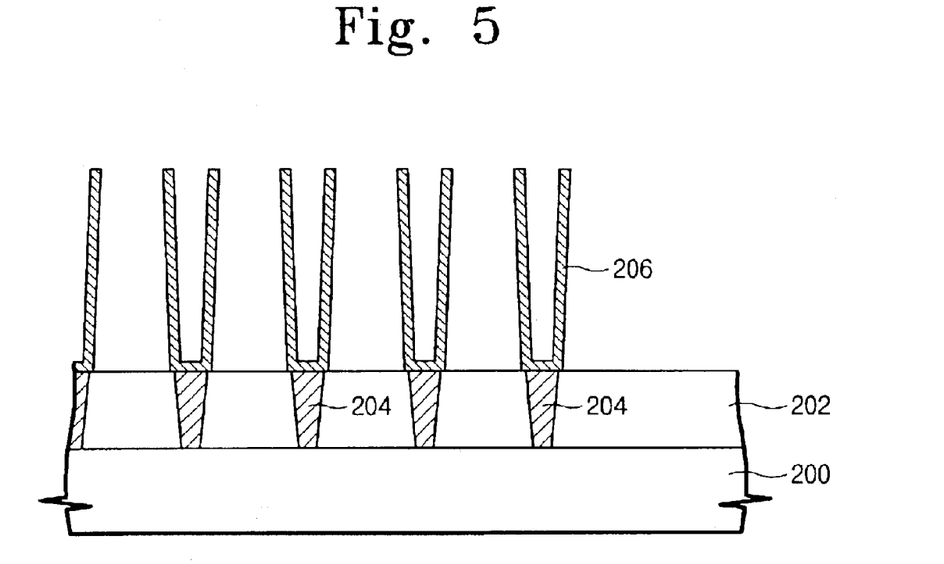
FIGS. 5 through 10 are cross-sectional views for illustrating a method for fabricating a semiconductor device according to a first embodiment of the present invention.

Referring to FIG. 5, an interlayer insulation layer 202 is formed on a semiconductor substrate 200. A plurality of storage node plugs 204 are connected to a predetermined region of the semiconductor substrate 200 through the interlayer insulation layer 202. Each storage node plug 204 is connected to a transistor source region formed in the semiconductor substrate 200. The storage node plugs 204 may be composed of refractory materials, for example, tungsten. A storage node electrode 206 is then formed on the interlayer insulation layer 202 electrically connected to each storage node plug 204. The storage node electrode 206 may be of a cylinder-type structure or a box-type structure. To fabricate a capacitor having high capacitance while occupying a small area, it is preferable that the storage node electrode 206 be formed with maximum height above the interlayer insulation layer 202.

To form the storage node electrode 206, a sacrificial oxide layer is formed on the interlayer insulation layer 202 and then etched to form a storage node hole. The storage node hole is filled with a conductive layer. Next, the conductive layer is planarized to form the storage node electrode 206 corresponding to each cell. Finally, the sacrificial oxide layer is removed. As a result, a structure illustrated in FIG. 5 can be obtained. To prevent the interlayer insulation layer 202 from being etched together while removing the sacrificial oxide layer, an etch stop layer may be formed before forming the sacrificial oxide layer.

The storage node electrode 206 may be composed of polysilicon. However, when a capacitor dielectric layer (208 of FIG. 6), which will be formed in subsequent processes, is composed of a high k-dielectric material, the storage node electrode 206 is preferably composed of an element of the platinum group such as ruthenium, rhodium, palladium, iridium, osmium, and platinum, to improve leakage current characteristics of the capacitor dielectric layer 208.

Figure 6:
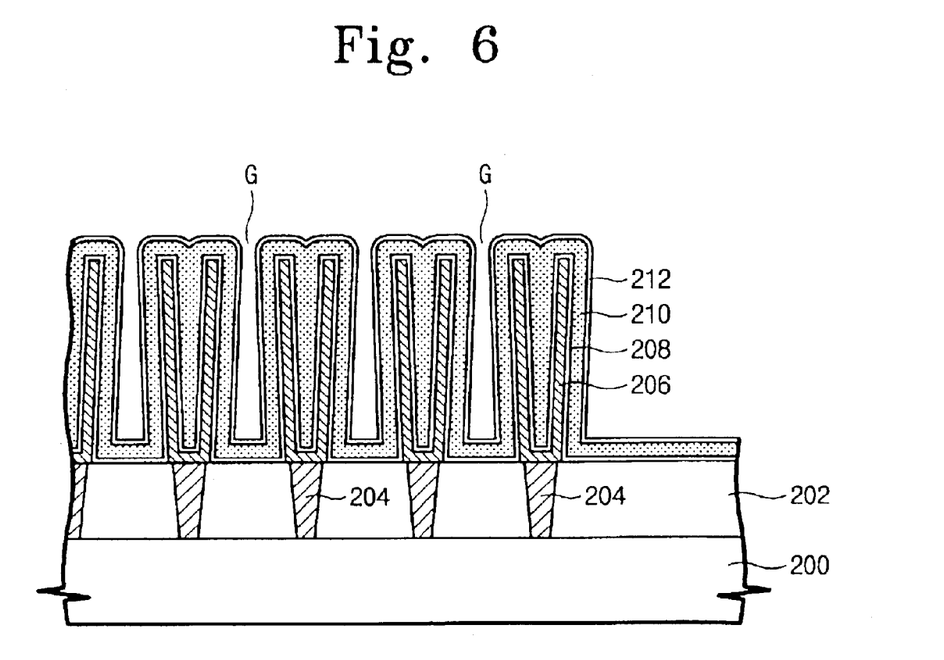

Referring to FIG. 6, the capacitor dielectric layer 208 is conformally formed on the storage node electrodes 206. To fabricate the capacitor having high capacitance, the capacitor dielectric layer 208 is preferably composed of high k-dielectric materials, for example, at least one selected from the group consisting of $Ta_2O_5$, $Al_2O_3$, $TiO_2$, $CeO_2$, PZT ($Pb[Zr,Ti]O_3$) and SBT ($SrBi_2Ta_2O_9$). Subsequently, a plate electrode layer 210 is conformally formed on the capacitor dielectric layer 208. As illustrated in FIG. 6, if the storage node electrode 206 is formed of a cylinder-type structure, the inside of a cylinder of the storage node electrode 206 may be completely filled or not, according to an aspect ratio of the inside of the cylinder as well as a thickness of the plate electrode layer 210. Like the storage node electrode 206, the plate electrode layer 210 is preferably composed of an element of the platinum group like ruthenium, rhodium, palladium, iridium, osmium, and platinum. Since the plate electrode layer 210 conformally covers the storage node electrodes 206, a gap G surrounded by the plate electrode layer 210 is formed between the storage node electrodes 206. Forming the plate electrode layer 210 of a large thickness may prevent the gap G from being formed between storage node electrodes 206. However, because elements of the platinum group are costly noble metals, the plate electrode layer 210 is preferably formed to have a thin thickness to reduce fabrication costs of semiconductor devices. After forming the plate electrode layer 210, an oxidation barrier layer 212 may be additionally formed the plate electrode layer 210 to prevent oxidation of the plate electrode layer 210. The oxidation barrier layer 212 is preferably a titanium oxide layer or a titanium nitride layer.

Figure 7:
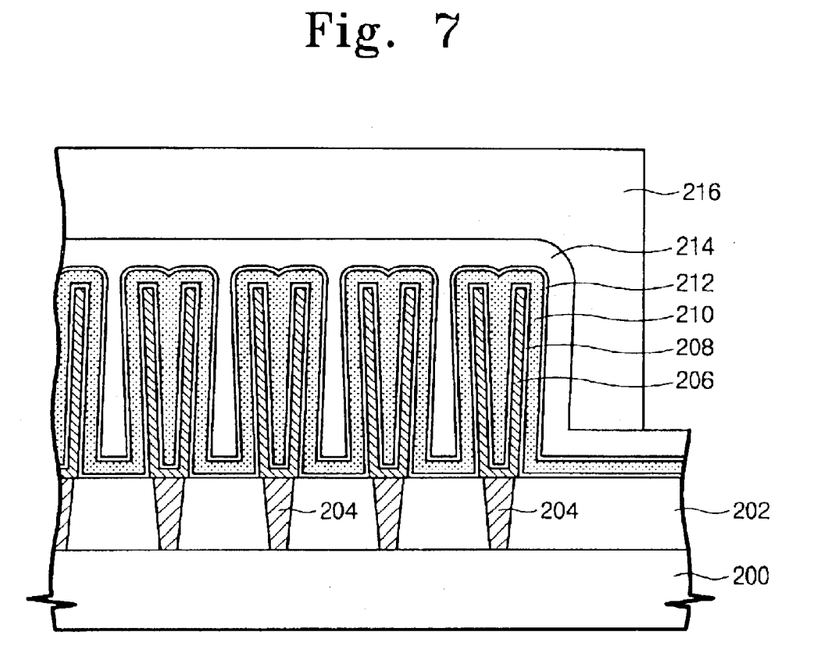

Referring to FIG. 7, a hard mask layer 214 is formed on the plate electrode layer 210. If the oxidation barrier layer 212 is formed, the hard mask layer 214 is formed on the oxidation barrier layer 212. Preferably, the hard mask layer 214 may be a silicon oxide layer, an aluminum oxide layer, a silicon nitride layer, or combinations thereof. A person skilled in the art will appreciate that other suitable insulating materials can be used to form the hard mask layer 214. The hard mask layer 214 fills the gap G surrounded by the plate electrode layer 210 between the adjacent storage node electrodes 206.

In the prior art, after forming a plate electrode layer or after forming an oxidation barrier layer, a plate electrode is formed by photolithography and etching. Accordingly, after forming the plate electrode, photoresist residues remained in a gap G surrounded by the plate electrode layer.

According to an embodiment of the present invention, however, the hard mask layer 214 fills the gap G surrounded by the plate electrode layer 210 so that photoresist residues can be substantially completely removed.

Subsequently, a photoresist pattern 216 is formed on the hard mask layer 214 to form the plate electrode 210

Figure 8:
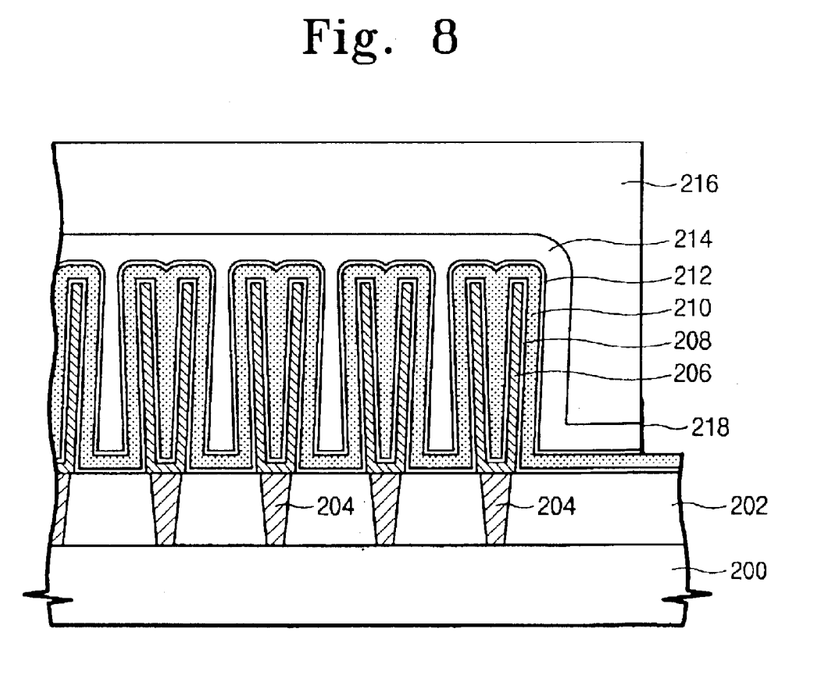

Referring to FIG. 8, the hard mask layer 214 is patterned to expose the plate electrode layer 210 using the photoresist pattern 216 as an etch mask. If the oxidation barrier layer 212 is formed, the oxidation barrier layer may be patterned together with the hard mask layer 214. At this time, an etch gas for patterning the hard mask layer 214 may react on the photoresist pattern 216 as well as the exposed plate electrode layer 210. As a result, a hard polymer fence 218 may be formed at etch boundaries of the hard mask layer 214. Unlike the conventional method, because the amount of reaction between the etch gas and the plate electrode layer is small, the amount of the resulting polymer is also small.

Figure 9:
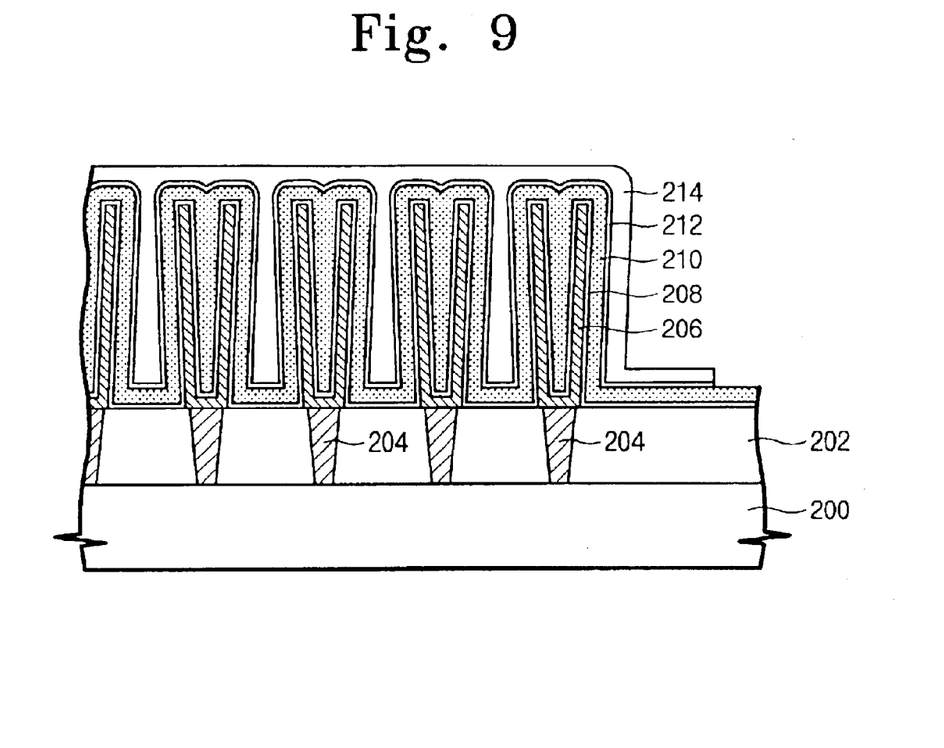

Referring to FIG. 9, the photoresist pattern 216 is removed. During this removal process, a major amount of the hard polymer fence 218 is also removed. To substantially completely remove a small portion of the hard polymer fence 218 still remaining at the etching boundaries, a physical etching process is performed. The physical etching process employs sputtering using a gas of the carbon-fluorine group such as $CF_4$ or $CHF_3$. Otherwise, high-speed argon aerosols may be injected onto the hard mask layer 214. As a result, the hard mask layer 214 is partially etched and the remaining hard polymer fence 218 can be removed concurrently.

Figure 10:
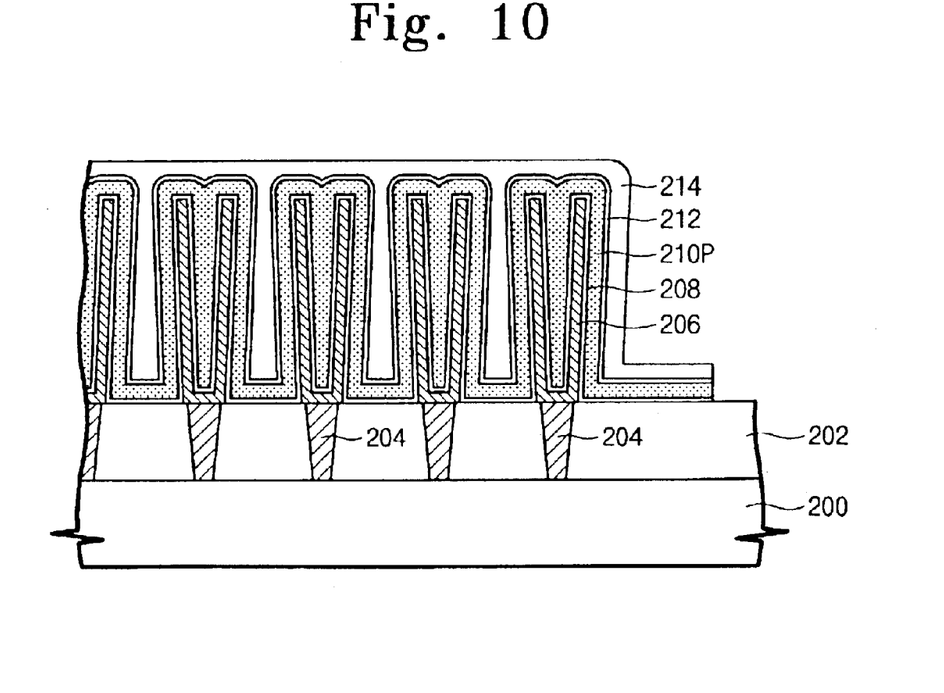

Referring to FIG. 10, the exposed plate electrode layer 210 is etched to form a plate electrode 210p on each sector of a cell array, using the hard mask layer 214 as an etch mask. Consequently, the hard mask layer 214 fills the gap G surrounded by the plate electrode layer 210, thereby preventing the photoresist residues from remaining in the gap G, as in the prior art. In addition, the plate electrode 210p is formed using the hard mask layer as an etch mask and the polymer is removed by using a physical etching process. Thus, the hard polymer fence can be hardly formed. Even if the hard polymer fence is formed, it can be effectively removed from the etching boundaries.

Figure 11:
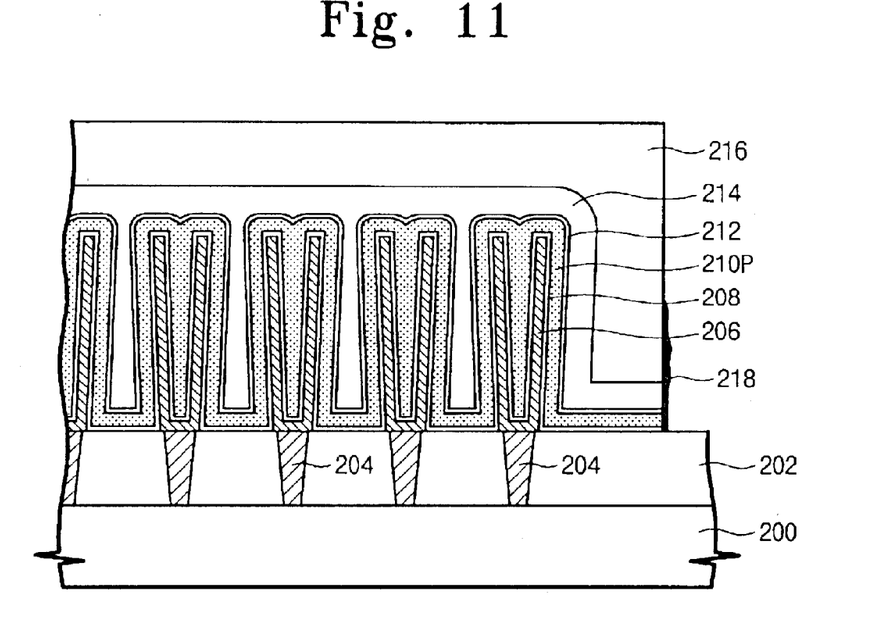
FIGS. 11 and 12 are cross-sectional views for illustrating a method for fabricating a semiconductor device according to a second embodiment of the present invention.
Figure 12:
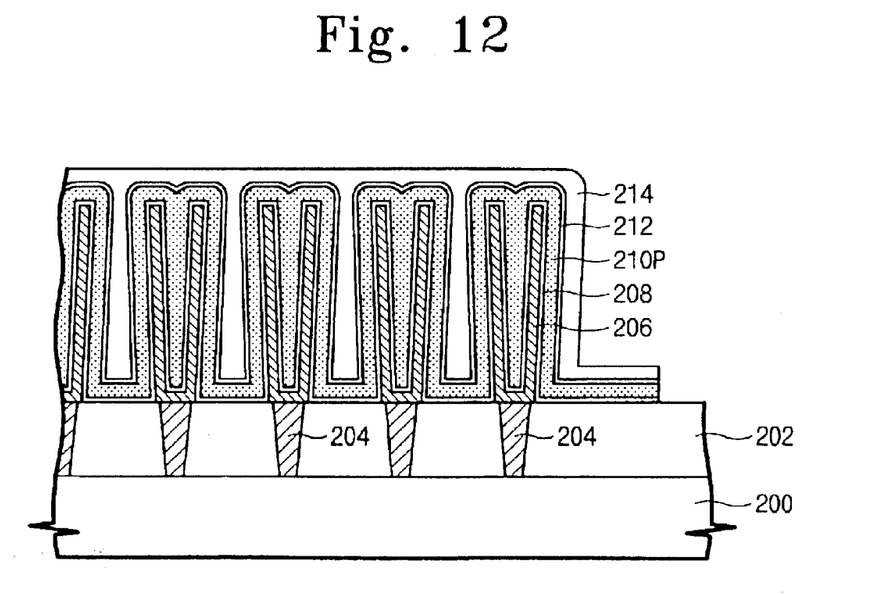

FIGS. 11 and 12 are cross-sectional views for illustrating a method for fabricating a semiconductor device according to a second embodiment of the present invention.

Referring to FIG. 11, as in the first embodiment, a storage node electrode 206, a capacitor dielectric layer 208, a plate electrode layer 210, and a hard mask layer 214 are formed on a semiconductor substrate 200. A photoresist pattern 216 is formed on the hard mask layer 214 to form a plate electrode. Next, the hard mask layer 14 and the plate electrode layer 210 are successively patterned to form the plate electrode 210p on each sector of a cell array using the photoresist pattern 216 as an etch mask. In this case, an etch gas reacts on the photoresist pattern as well as the plate electrode layer, which is composed of an element of the platinum group. Thus, a hard polymer fence 218 is formed not only at etching boundaries between the plate electrode layer 210 and the hard mask layer 214, but also on sidewalls of the photoresist pattern 216.

Referring to FIG. 12, the photoresist pattern 216 is removed. In the second preferred embodiment, since the plate electrode layer 210 is etched using the photoresist pattern 216 as an etch mask, a large quantity of hard polymer is formed. Accordingly, in ashing and strip processes for removing the photoresist pattern 216, the hard polymer fence 218p is not removed sufficiently and may still remain to undesirably affect subsequent fabrication processes.

Like the first embodiment, however, the hard polymer fence 218, which is not removed by the ashing and strip processes, can be substantially completely removed using a physical etching process. The plate electrode 210p is protected by the hard mask layer 214 during the physical etching process.

Figure 13:
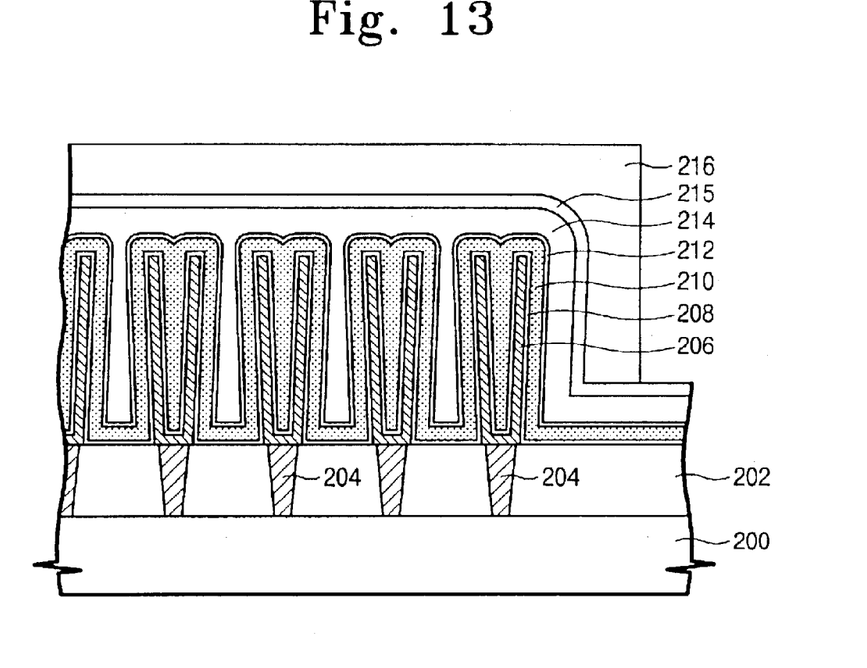
FIGS. 13 through 16 are cross-sectional views for illustrating a method for fabricating a semiconductor device according to a third embodiment of the present invention.

FIGS. 13 through 16 are cross-sectional views for illustrating a method for fabricating a semiconductor device according to a third embodiment of the present invention. Referring to FIG. 13, a plate electrode layer 210 and a hard mask layer 214 are formed as in the first embodiment. A silicon nitride layer 215 is formed on the hard mask layer 214. Thereafter, a photoresist pattern 216 is formed on a silicon nitride layer 215 to form a plate electrode 210p.

Figure 14:
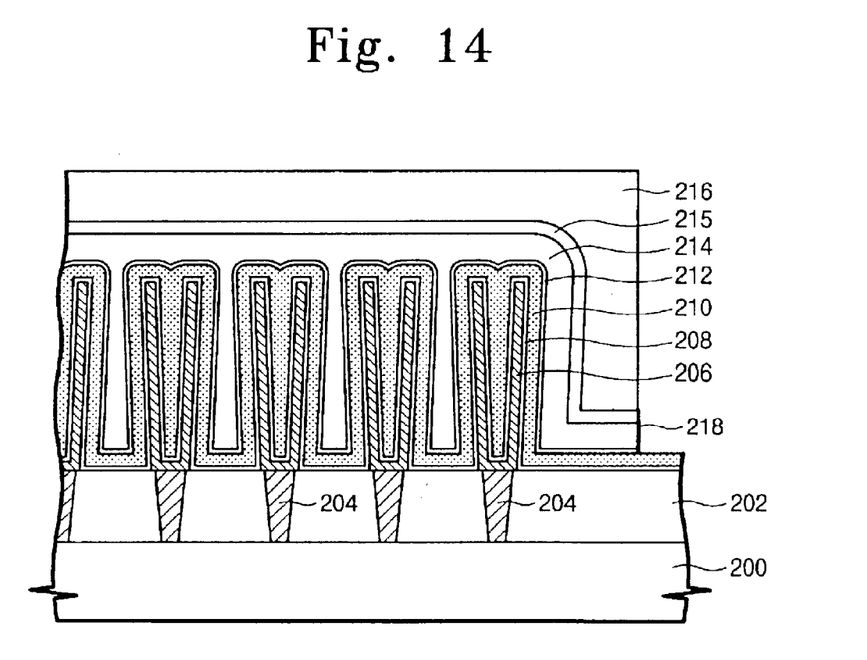

Referring to FIG. 14, the silicon nitride layer 215 and the hard mask layer 214 are successively patterned to expose the plate electrode layer 210 using the photoresist pattern 216 as an etch mask. At this time, an etch gas may react on the photoresist pattern 216 as well as on the plate electrode layer 210. Thus, a hard polymer fence 218 is formed not only at etching boundaries between the hard mask layer 214 and the silicon nitride layer 215, but also on sidewalls of the photoresist pattern 216. However, since the polymer fence 218 is formed by polymer resulting from an over-etching process of the hard mask layer 214, the polymer fence 218 is formed to have a very small quantity as compared with conventional methods.

Figure 15:
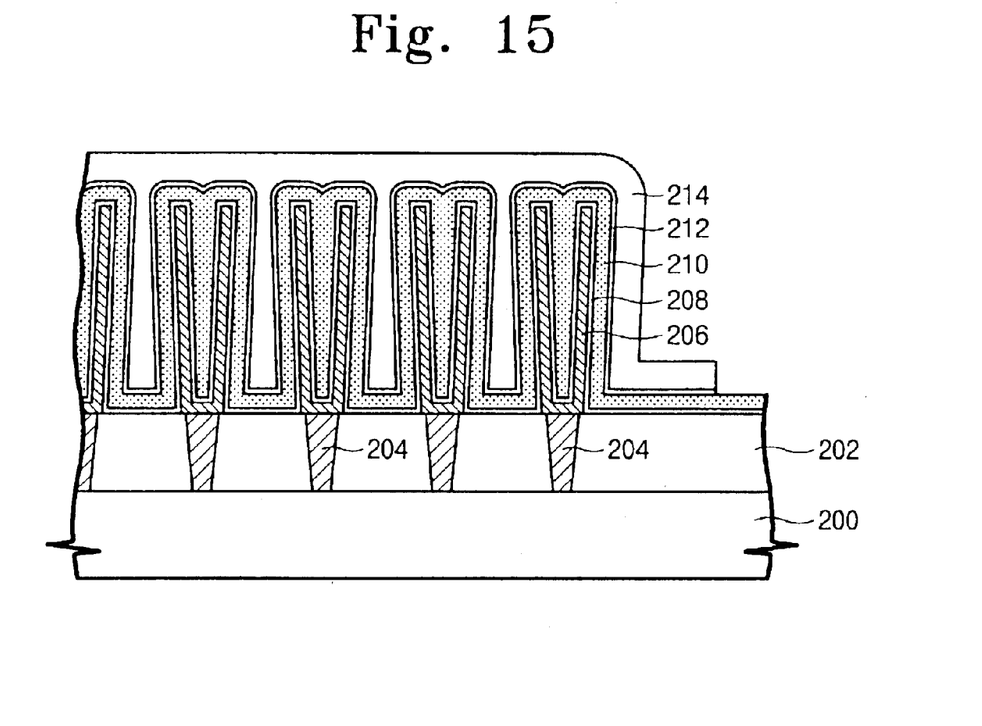

Referring to FIG. 15, the photoresist pattern 216 is removed. The silicon nitride layer 215 is then removed using an isotropic etch process. For example, the silicon nitride layer 215 is preferably removed by a wet etching process using a phosphoric acid solution. With embodiments of the present invention as described above, because only a small quantity of polymer is generated, it is relatively easy to remove the polymer fence during ashing and stripping processes for removing the photoresist pattern 216. The unremoved polymer may be removed together with the silicon nitride layer 215.

Figure 16:
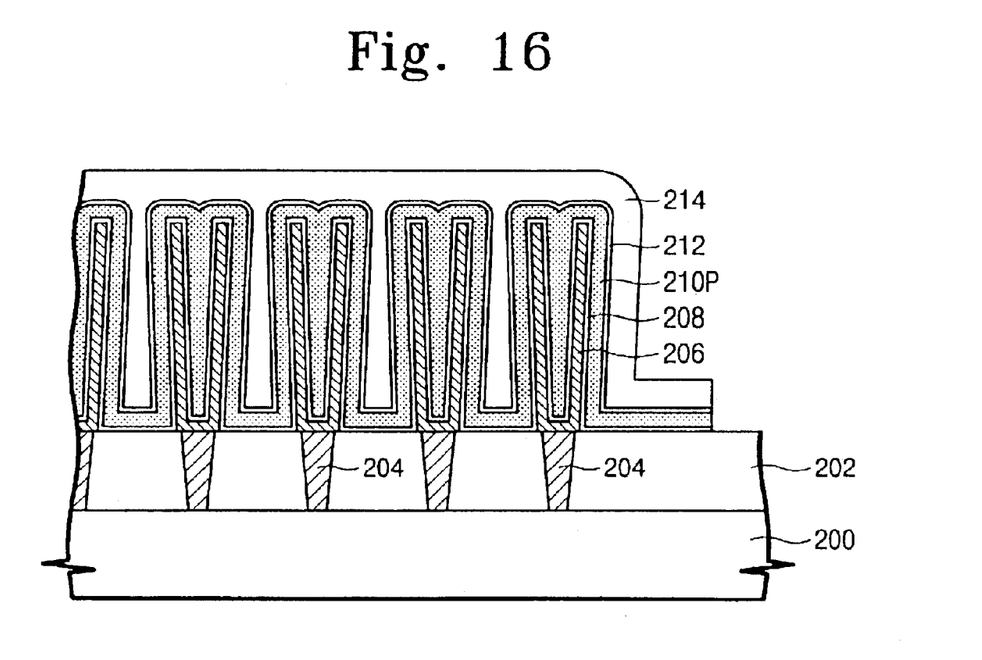

Referring to FIG. 16, the plate electrode layer 210 is etched to form a plate electrode 210 on each sector of a cell array using the hard mask layer 214 as an etch mask to complete a capacitor of a semiconductor device. In the subsequent processes, interconnects and a passivation layer are formed using conventional methods.

Figure 17:
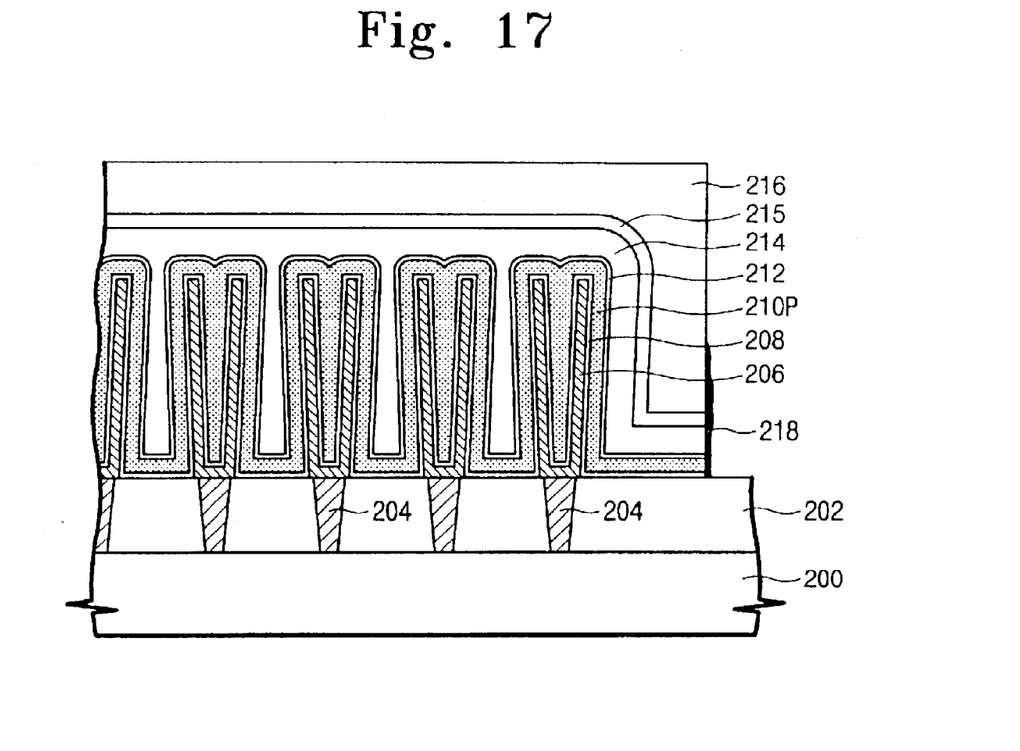
FIGS. 17 and 18 are cross-sectional views for illustrating a method for fabricating a semiconductor device according to a preferred embodiment of the present invention.
Figure 18:
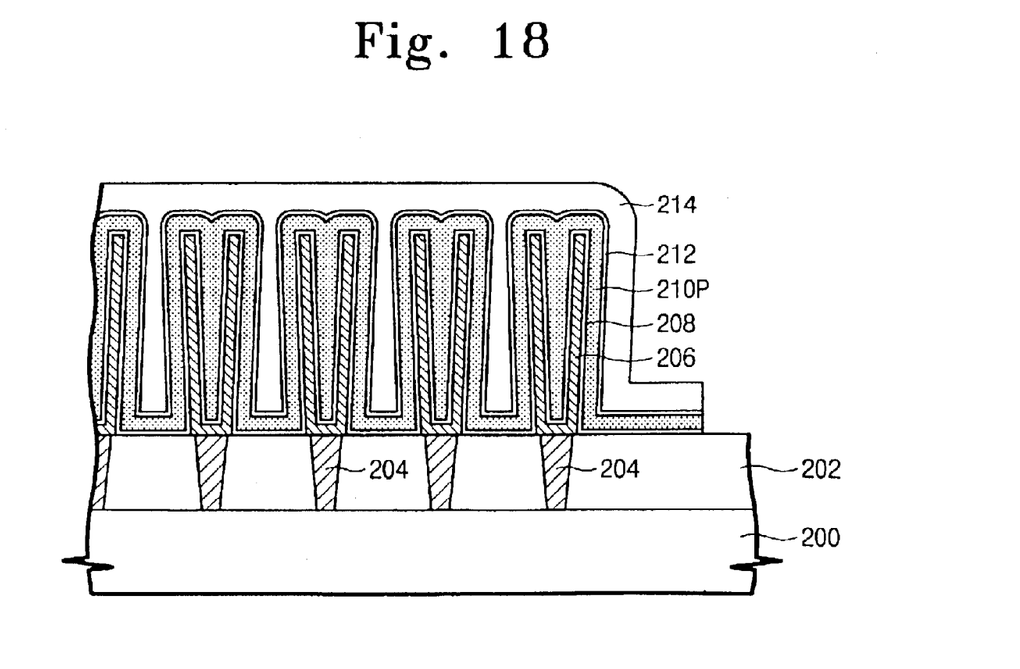

FIGS. 17 and 18 are cross-sectional views illustrating a method for fabricating a semiconductor device according to a fourth embodiment of the present invention.

Referring to FIG. 17, as in third embodiment, a plate electrode layer 210, a hard mask layer 214, and a silicon nitride layer 215 are formed. A photoresist pattern 216 is then formed on the silicon nitride layer 215 to form a plate electrode 210p. Sequentially, the silicon nitride layer 215, the hard mask layer 214, and the plate electrode layer 210 are successively patterned to form the plate electrode 210p on each sector of a cell array using the photoresist pattern 216 as an etch mask. In this case, an etch gas may react on the photoresist pattern 216 as well as the plate electrode layer 210, which is composed of an element of the platinum group. This may result in formation of the hard polymer fence 218 at etching boundaries, as discussed above.

Referring to FIG. 18, the polymer fence 218 can be removed together with the silicon nitride layer 215 after removing the photoresist pattern 216. More specifically, after forming the plate electrode 210p, strip and ashing processes are carried out to remove the photoresist pattern 216. At this time, the hard polymer fence 218 is partially removed. The silicon nitride layer 215 is then removed using an isotropic etch process, thereby removing the remaining hard polymer fence 218 together with the silicon nitride layer 215.

As described above, the photoresist residues as well as the polymer do not remain after forming the plate electrode of the capacitor. Accordingly, the present invention can prevent the photoresist residues and the polymer from acting as contamination sources during subsequent processes.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A method for fabricating a semiconductor device, the method comprising:

forming adjacent storage node electrodes on a semiconductor substrate;

forming a capacitor dielectric layer on the adjacent storage node electrodes;

forming a plate electrode layer on the capacitor dielectric layer, thereby defining a gap between the adjacent storage node electrodes; and filling the gap between the adjacent storage node electrodes by forming a hard mask layer on the plate electrode layer; and successively pattering the hard mask layer and the plate electrode layer to form a plate electrode.

2. The method as claimed in claim 1, wherein the storage node electrodes comprise polysilicon or noble metals.

3. The method as claimed in claim 2, wherein the noble metals are ruthenium, rhodium, palladium, iridium, osmium, or platinum.

4. The method as claimed in claim 1, wherein the capacitor dielectric layer is comprises $Ta_2O_5Al_2O_3,TiO_2$, $CeO_2$, $PZT(Pb[Zr,Ti]O_3)$,SBT $(SrBi_2Ta_2O_9)$, or combinations thereof.

5. The method as claimed in claim 1, wherein the plate electrode layer comprises noble metals.

6. The method as claimed in claim 5, wherein the mobile metals are ruthenium, rhodium, palladium, iridium, osmium, or platinum.

7. The method as claimed in claim 1, further comprising forming an oxidation barrier layer on the plate electrode layer after forming the plate electrode layer.

8. The method as claimed in claim 7, wherein the oxidation barrier layer is patterned together with the hard mask layer while forming the plate electrode.

9. The method as claimed in claim 7, wherein the oxidation barrier layer is a titanium oxide layer or a titanium nitride layer.

10. The method as claimed in claim 1, wherein the hard mask layer is a silicon oxide layer or an aluminum oxide layer.

11. The method as claimed in claim 1, wherein forming the plate electrode comprises:

forming a photoresist pattern on the hard mask layer;

patterning the hard mask layer, using the photoresist pattern as an etch mask, to expose the plate electrode layer;

removing the photoresist pattern;

thereafter, patterning the plate electrode layer using the hard mask layer as an etch mask; and removing polymer formed at etching boundaries of the plate electrode.

12. The method as claimed in claim 11, wherein the polymer is removed by sputtering, wherein the hard mask layer prevents the plate electrode from being attacked.

13. The method as claimed in claim 12, wherein the polymer is removed using a gas of the carbon-fluorine group.

14. The method as claimed in claim 11, wherein the polymer is removed using argon aerosols, wherein the hard mask layer prevents the plate electrode from being attacked.

15. The method as claimed in claim 1, wherein forming the plate electrode comprises:

forming a photoresist pattern on the hard mask layer;

successively patterning the hard mask layer and the plate electrode layer using the photoresist pattern as an etch mask;

removing the photoresist pattern; and removing polymer formed at etching boundaries of the plate electrode.

16. The method as claimed in claim 15, wherein the polymer is removed by sputtering, wherein the hard mask layer prevents the plate electrode from being attacked.

17. The method as claimed in claim 16, wherein the polymer is removed by sputtering using a gas of the carbon-fluorine group.

18. The method as claimed in claim 15, wherein the polymer is removed using argon aerosols, wherein the hard mask layer prevents the plate electrode from being attacked.

19. The method as claimed in claim 1, further comprising forming a silicon nitride layer on the hard mask layer.

20. The method as claimed in claim 19, wherein forming the plate electrode comprises:

forming a photoresist pattern on the silicon nitride layer to form the plate electrode;

successively patterning the silicon nitride layer and the hard mask layer, using the photoresist pattern as an etch mask, to expose the plate electrode layer;

removing the photoresist pattern;

patterning the plate electrode layer using the hard mask layer as an etch mask; and etching the silicon nitride layer, using an isotropic etch process, to remove polymer formed at etching boundaries of the plate electrode.

21. The method as claimed in claim 20, wherein, when the polymer is removed, the silicon nitride layer is etched by a wet etching process.

22. The method as claimed in claim 21, wherein the wet etching process is performed using a phosphoric acid solution.

23. The method as claimed in claim 20, wherein forming the plate electrode comprises:

forming a photoresist pattern on the hard mask layer to form the plate electrode;

successively patterning the silicon nitride layer and the plate electrode layer using the photoresist pattern as an etch mask to form the plate electrode;

removing the photoresist pattern; and etching a portion of the silicon nitride layer to remove polymer formed at etching boundaries of the plate electrode together with the portion of the silicon nitride layer.

24. The method as claimed in claim 23, wherein, when the polymer is removed, the silicon nitride layer is etched by a wet etching process.

25. The method as claimed in claim 24, wherein the wet etching process is performed using a phosphoric acid solution.

* * * * *

UNITED STATES PATENT AND TRADEMARK OFFICE
CERTIFICATE OF CORRECTION

PATENT NO. : 6,753,221 B2
DATED : June 22, 2004
INVENTOR(S) : Jeon et al.

It is certified that error appears in the above-identified patent and that said Letters Patent is hereby corrected as shown below:

Column 7,
Line 33, "$Ta_2O_5Al_2O_3$," should read -- $Ta_2O_5$, $Al_2O_3$, --.
Line 38, "mobile metals" should read -- noble metals --.

Signed and Sealed this

Eleventh Day of January, 2005

JON W. DUDAS
*Director of the United States Patent and Trademark Office*